United States Patent
Hille et al.

(10) Patent No.: US 12,100,917 B2
(45) Date of Patent: Sep. 24, 2024

(54) ELECTRICAL CONNECTION DEVICE AND METHOD FOR MOUNTING AN ELECTRICAL CONNECTION DEVICE

(71) Applicant: ALAC ELEKTRIK MECHANIK VERTRIEB GMBH, Kirchhundem (DE)

(72) Inventors: Jan Hille, Olpe (DE); Timo Engelbrecht, Kreuztal (DE)

(73) Assignee: ALAC ELEKTRIK MECH VERTRIEB GMBH, Kirchhundem (DE)

(*) Notice: Subject to any disclaimer, the term of this patent is extended or adjusted under 35 U.S.C. 154(b) by 170 days.

(21) Appl. No.: 17/913,556

(22) PCT Filed: Mar. 19, 2021

(86) PCT No.: PCT/EP2021/057044
§ 371 (c)(1),
(2) Date: Sep. 22, 2022

(87) PCT Pub. No.: WO2021/191061
PCT Pub. Date: Sep. 30, 2021

(65) Prior Publication Data
US 2023/0107112 A1    Apr. 6, 2023

(30) Foreign Application Priority Data
Mar. 27, 2020   (DE) .......................... 102020108507.9

(51) Int. Cl.
*H01R 13/66* (2006.01)
*G01K 1/14* (2021.01)
(Continued)

(52) U.S. Cl.
CPC ........... *H01R 13/6683* (2013.01); *G01K 1/14* (2013.01); *H01R 13/20* (2013.01); *H01R 13/6658* (2013.01); *H05K 5/0069* (2013.01)

(58) Field of Classification Search
CPC ...... G01K 1/14; H01R 13/20; H01R 13/6683; H01R 13/6658; H05K 5/0069
See application file for complete search history.

(56) References Cited

U.S. PATENT DOCUMENTS

2018/0097316 A1* 4/2018 Rose ...................... H01R 12/58

FOREIGN PATENT DOCUMENTS

DE    102015106251 A1    10/2016
DE    102016211876 A1    1/2018
(Continued)

OTHER PUBLICATIONS

International Preliminary Report on Patentability for International Patent Application No. PCT/EP2021/057044, date of issuance: Sep. 22, 2022, 9 pages.

(Continued)

*Primary Examiner* — Alesa Allgood
(74) *Attorney, Agent, or Firm* — Christopher J. Volkmann; Kelly, Holt & Christenson, PLLC.

(57) ABSTRACT

An electrical connection device includes at least one contact and a carrier. The carrier includes at least one receptacle and the at least one contact inserted into the at least one receptacle. The carrier includes a printed circuit board and at least one temperature sensor arranged on the printed circuit board in a vicinity of the at least one contact. The printed circuit board includes an electrically insulating layer and an electrically conductive top layer separated from a support plate by the electrically insulating layer. The electrically conductive top layer is arranged in a region of a recess of the electrically insulated layer and includes an outer connection (Continued)

region and an inner contact region. The inner contact region is formed by the at least one contact through a recess of the support plate. The electrically conductive top layer rests against a lateral surface of the at least one contact.

20 Claims, 5 Drawing Sheets

(51) Int. Cl.
   *H01R 13/20* (2006.01)
   *H05K 5/00* (2006.01)

(56) References Cited

FOREIGN PATENT DOCUMENTS

| DE | 102018120057 A1 | 2/2019 |
| EP | 3528349 A1 | 8/2019 |
| WO | WO 2018197247 A1 | 11/2018 |

OTHER PUBLICATIONS

International Search Report and Written Opinion for International Patent Application No. PCT/EP2021/057044, mailing date of Jun. 23, 2021, 20 pages with English Translation.
Search Report for German Patent Application No. 102020108507.9 dated Mar. 6, 2021, 6 pages.

\* cited by examiner

ELECTRICAL CONNECTION DEVICE AND METHOD FOR MOUNTING AN ELECTRICAL CONNECTION DEVICE

CROSS-REFERENCES TO RELATED APPLICATIONS

This application is a Section 371 National Stage Application of International Application No. PCT/EP2021/057044, filed Mar. 19, 2021, and published as WO 2021/191061 A1 on Sep. 30, 2021, and claims priority to German Application No. 102020108507.9, filed Mar. 27, 2020, the contents of both are hereby incorporated by reference in their entirety.

DETAILED DESCRIPTION

The present disclosure relates to an electrical connection device, and to a method for mounting an electrical connection device.

DE 10 2016 211 876 A1 describes a charging plug embodied as an electrical connection device, which comprises at least one contact, at least one temperature sensor and at least one printed circuit board, wherein the contact is guided through a recess in the printed circuit board, and wherein the temperature sensor is arranged on the printed circuit board in the vicinity of the contact.

An object of the present disclosure is to develop an electrical connection device and a method for mounting an electrical connection device, which can be produced or implemented cost-effectively and easily, by means of which a current temperature of the at least one contact can be monitored particularly reliably and by means of which a reliable attachment of a contact to a temperature monitor can be produced.

The electrical connection device according to the one example of the present disclosure comprises at least one contact and a carrier,
wherein the carrier comprises at least one receptacle and the contact is inserted into said receptacle,
wherein the carrier comprises a printed circuit board and at least one temperature sensor,
wherein the temperature sensor is arranged on the printed circuit board in the vicinity of the contact,
wherein the printed circuit board comprises an electrically insulating layer and an electrically conductive top layer separated from a support plate by the electrically insulating layer,
wherein the electrically conductive top layer is arranged in the region of a recess of the electrically insulated layer and comprises an outer connection region and an inner contact region,
wherein the inner contact region is formed by the contact through a recess of the support plate in such a way that the electrically conductive top layer rests against a lateral surface of the contact.

By simply applying the electrically conductive top layer against the lateral surface, the electrical connection device can be easily produced.

Furthermore, it is provided to connect the electrically conductive top layer to the electrically insulated layer around the recess of the latter. This effectively prevents the electrically conductive top layer from slipping.

It is also provided to make the support plate rigid and the printed circuit board flexible compared to the support plate. This gives the flexible printed circuit board stability through the support plate.

It is furthermore provided that the printed circuit board comprises an electrically conductive bottom layer as a third layer, wherein the electrically conductive bottom layer is galvanically isolated from the electrically conductive top layer by the electrically insulating layer, wherein the temperature sensor is arranged on the electrically conductive bottom layer and is connected to contact points formed by the electrically conductive bottom layer, wherein the temperature sensor is positioned in such a way that it faces a segment of the electrically conductive top layer, wherein the insulating layer is made in particular of polyimide. Such a structure allows the temperature of the individual contacts to be reliably monitored, since the temperature-conducting components have only a low heat capacity and are only minimally spaced from one another for electrical isolation. Thus, temperature changes of the individual contacts can be detected by the temperature sensor with a short delay. By using polyimide for the insulating layer, the latter has thermally conductive properties so that the electrically conductive top layer and the electrically conductive bottom layer are thermally coupled to each other. The electrically conductive top layer and the electrically conductive bottom layer are designed to store heat as copper layers, but have a low inertia relative to the heat source, which is formed by the contacts, with respect to a temperature change.

Furthermore, it is provided to provide at least one recess in the support plate, wherein the recess is open towards the top side of the support plate facing the printed circuit board, and wherein the recess is positioned and dimensioned in such a way that the temperature sensor is received in the recess. In this way, the temperature sensor is mechanically protected and also electrically insulated from the contact(s), so that trouble-free operation is ensured.

It is also provided that
the contact points to which the temperature sensor is connected are attached to lines,
the lines in the form of conductor tracks are formed by the electrically conductive bottom layer, wherein these have a meandering course towards the temperature sensor, and
wherein it is particularly provided that the electrical connection device comprises a control device and that the at least one temperature sensor is attached to the control device via the lines,
wherein it is also particularly provided that the printed circuit board comprises a polyimide film covering the conductor tracks.

The meandering course of the conductor tracks reduces the unwanted dissipation of heat and thus prevents a falsification of the measurement results. Due to the polyimide film, the conductor tracks are additionally electrically insulated and protected.

Furthermore, it is provided to equip the electrical connection device with an upper cover plate resting on the printed circuit board and/or to equip the electrical connection device with a lower cover plate resting on the support plate. The cover plates further stabilize the support plate so that it can reliably hold the at least one contact pin. Furthermore, the lower cover plate optimizes the contact between the conductive top layer and the one or more contacts.

It is also provided to form a top side of the support plate adjacent to the recess thereof as a primary bending edge over which the electrically conductive top layer of the printed circuit board is bent by 5° to 90° and in particular by at least 15°. This turns the support plate itself into a mounting tool, so that the production of the electrical connection device is simplified.

Furthermore, it is also intended to equip the electrical connection device with an upper cover plate, wherein the upper cover plate comprises an upper through-bore aligned with the recesses of the printed circuit board, and wherein the upper cover plate covers a top side of the printed circuit board, and/or to equip the electrical connection device with a lower cover plate, wherein the lower cover plate comprises a lower through-bore aligned with the recesses of the printed circuit board, and wherein the lower cover plate covers a bottom side of the support plate. In this way, in each of the three designs a stabilized support is formed, which can reliably hold the one or more contacts.

Furthermore, it is provided that a circumferential edge of the lower cover plate, at which a top side of the lower cover plate transitions into a lower through-bore, forms a secondary bending edge, by which the electrically conductive top layer of the printed circuit board is molded against the lateral surface of the contact in such a way that the electrically conductive top layer is clamped between an inner lateral surface of the lower through-bore and the lateral surface of the contact. Hereby, the lower cover plate itself is turned into another mounting tool, so that the production of the electrical connection device is simplified and a reliable contact to the electrically conductive top layer is established.

It is also provided to equip the electrical connection device with the two contacts and the carrier, wherein the carrier comprises the support plate and the printed circuit board and, in particular, the upper cover plate and, in particular, the lower cover plate, wherein these plates are connected to one another and each comprise a slot arranged between the contacts, wherein the contacts are arranged in a mirror image with respect to the slots. This provides electrical and thermal insulation of the contacts, so that the measurement result can be less influenced by the other contact in each case. The improved electrical insulation is achieved in particular by increasing the creepage distance.

Furthermore, it is also provided that the recess in the support plate is formed as a polygonal recess, and that the lower through-bore in the lower cover plate is circular, wherein it is provided in particular that the lower through-bore forms an incircle of the polygonal recess in a projection in the direction of a longitudinal axis of the contact. As a result, during the mounting process, when the one or more contacts is/are inserted into its/their receptacles, the carrier has an increasingly stronger influence on a deformation of the electrically conductive top layer of the printed circuit board as the insertion distance progresses, so that an abrupt deformation which may damage the electrically conductive top layer is avoided.

It is also provided that the outer connection region of the conductor region of the electrically conductive top layer surrounds the recess of the printed circuit board in a ring-like manner, and that the inner contact region of the electrically conductive top layer is formed by contact lugs extending from the outer connection region, wherein it is provided in particular that the number of contact lugs corresponds to the number of corners of the polygonal recess of the support plate.

This further facilitates the forming of the electrically conductive top layer, which forms the contact lugs as a component of the printed circuit board, and thus ensures defect-free production of the electrical connection device.

It is furthermore provided to provide the contact with a circumferential collar projecting beyond its lateral surface and to bring it into contact with a circular ring-shaped bottom side of its collar on the outer connection region of the electrically conductive top layer of the printed circuit board. This further increases a contact region between the contact and the electrically conductive top layer, so that the current temperature of the contact can be tapped more quickly and reliably.

Lastly, it is provided to form the electrical connection device as a charging plug and to form the at least one contact in each case as a contact pin or to form the electrical connection device as a charging socket and to form the at least one contact in each case as a contact sleeve. This simplifies the production since the carrier of the electrical connection device can be used both for the production of a charging plug and for the production of a charging socket.

The method according to the present disclosure for assembling an electrical connection device, in particular in accordance with at least one of claims 1 to 15, provides
that the electrical connection device comprises a carrier with at least one receptacle and at least one contact,
wherein the carrier, viewed in a direction of insertion of the contact, comprises a printed circuit board with an electrically conductive top layer, a primary bending edge, running circumferentially in particular in a polygonal shape, and a secondary bending edge, running circumferentially in particular in a circular shape,
wherein the electrically and thermally conductive top layer projects into the receptacle, in particular with contact lugs,
and comprises the following steps:
inserting the contact until the contact touches the electrically conductive top layer projecting into the receptacle,
inserting the contact further into the receptacle and thereby bending the electrically conductive top layer and in particular also the electrically insulating layer by the contact at the primary bending edge, and
inserting the contact further still into the receptacle and thereby bending the electrically conductive top layer and in particular also the electrically insulating layer by the contact at the secondary bending edge and applying the contact lugs against a lateral surface of the contact in such a way that the electrically conductive top layer is applied over its entire surface against the lateral surface of the contact in a region following the secondary bending edge.

This method allows a cost-effective and simple production of an electrical connection device since reliable contacting between the one or more contacts and the electrically conductive top layer is achieved when the one or more contacts is/are inserted into the receptacle or receptacles of the carrier. Such a tool-free mounting ensures an optimum attachment of the electrically conductive top layer to the one or more contacts, so that a current temperature of the at least one contact can be monitored particularly reliably.

For the purposes of the present disclosure, a temperature sensor is understood to mean, in particular, a thermal resistor or a semiconductor or an integrated circuit or a thermal radiation sensor.

Further details of the present disclosure are described in the drawing with reference to schematically illustrated exemplary embodiments.

Figure 1:
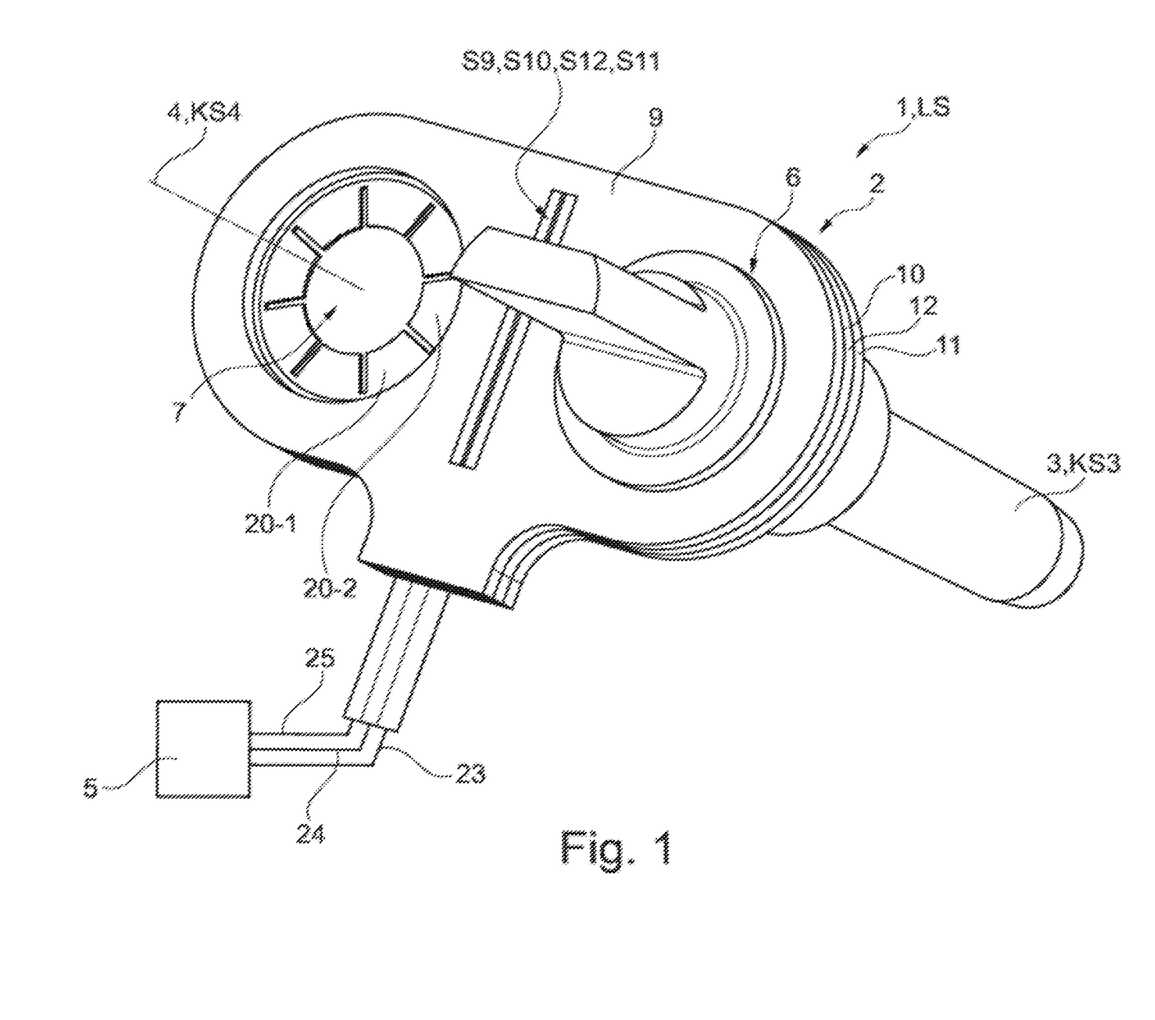
FIG. 1 shows a perspective view of an electrical connection device according to one example, wherein a second contact is hidden.

FIG. 1 shows a perspective view of an electrical connection device 1 according to one example. The electrical connection device 1 comprises a carrier 2, a first contact 3, a second contact 4, shown only symbolically by a line, and a control device 5, shown symbolically. The second contact 4 is of identical design to the first contact 3. The contact 3 is received in a first receptacle 6 of the carrier 2. The second contact 4 is received in a second receptacle 7 of the carrier 2. Furthermore, the carrier 2 comprises a slot S9-S10.

Figure 2:
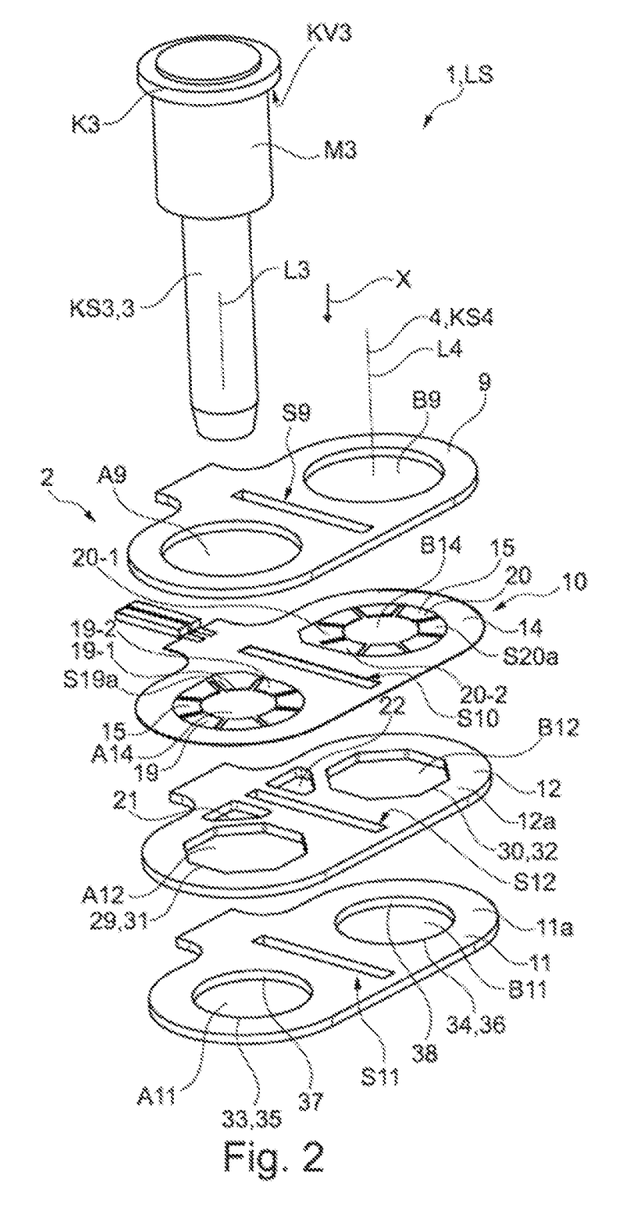
FIG. 2 shows an exploded view of the illustration of FIG. 1, wherein a control device is hidden.

In FIG. 2, the electrical connection device 1 is shown in an exploded view, wherein the control device 5 is hidden.

The carrier 2 comprises an upper cover plate 9, a flexible printed circuit board 10, a support plate 12 and a lower cover plate 11 (see also FIG. 1).

The flexible printed circuit board 10 comprises an electrically insulating layer 14 as a middle layer. Furthermore, the printed circuit board 10 comprises an electrically conductive top layer 15 arranged on the electrically insulating layer 14.

As can be seen from FIG. 4, which shows a detail of the exploded view shown in FIG. 2 from an opposite viewing direction, the printed circuit board 10, which is shown from below in FIG. 4, comprises an electrically conductive bottom layer 16 as a third layer.

The electrically conductive bottom layer 16 is galvanically isolated from the electrically conductive top layer 15 by the electrically insulating layer 14.

The carrier 2 furthermore also comprises two temperature sensors 17, 18. These are arranged on the electrically conductive bottom layer 16 of the printed circuit board 10 in the vicinity of the first contact 3 and the second contact 4, respectively.

Figure 3:
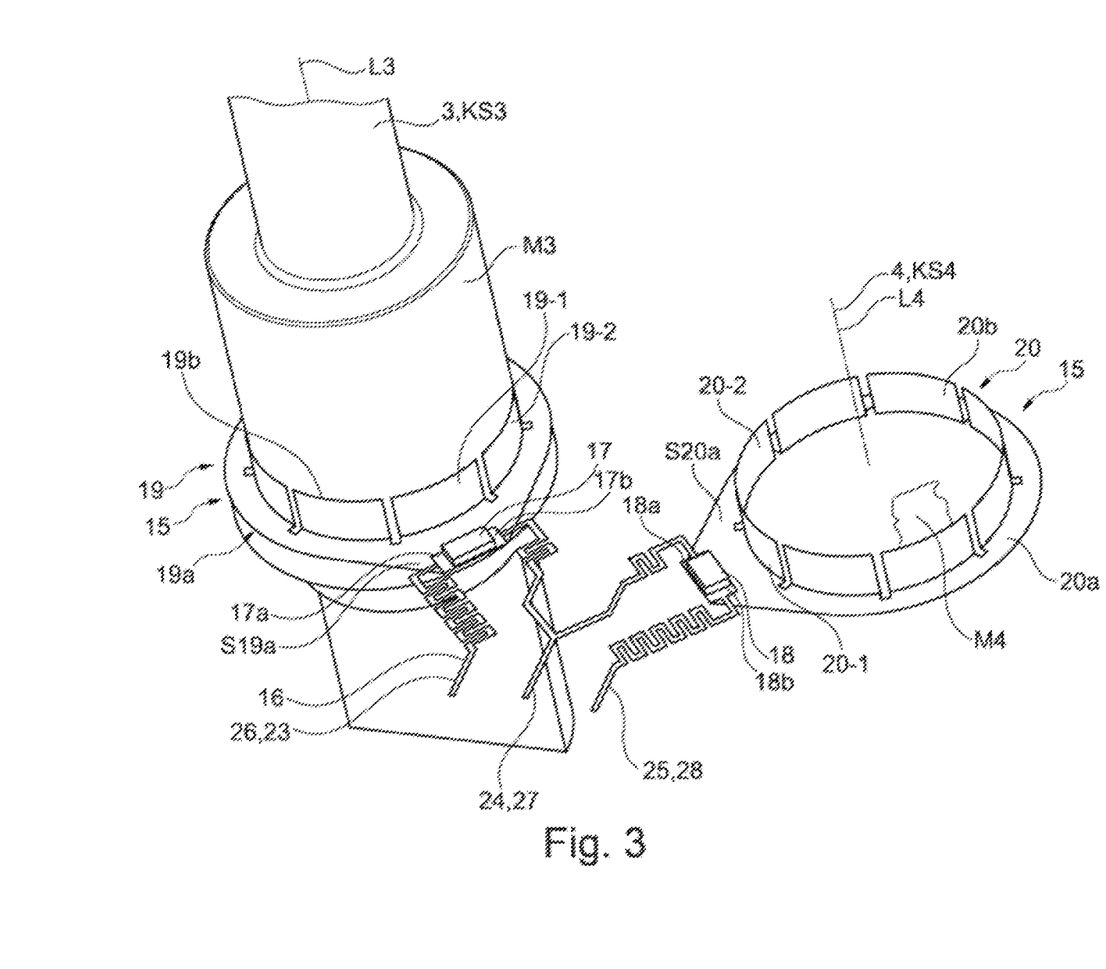
FIG. 3 shows a perspective view of individual components of the electrical connection device shown in FIGS. 1 and 2.

As can be seen from FIG. 3, which shows a perspective view of individual components of the electrical connection device 1 shown in FIGS. 1 and 2, the temperature sensors 17, 18 are attached to contact points 17a, 17b and 18a, 18b formed by the electrically conductive bottom layer 16. Here, the electrically insulating layer 14 is hidden in FIG. 3.

The electrically conductive top layer 15 is made in two parts and comprises a first conductor region 19 associated with the first contact 3 and a second conductor region 20 associated with the second contact 4.

The first conductor region 19 is arranged in the region of a first recess A14 of the electrically insulated layer 14 and comprises an outer connection region 19a and an inner contact region 19b. Here, the inner contact region 19b is formed by the first contact 3 through a first recess A12 of the support plate 12 in such a way that the electrically conductive top layer 15 rests with its contact region 19b against a lateral surface M3 of the first contact 3.

The second conductive region 20 is arranged in the region of a second recess B14 of the electrically insulated layer 14 and comprises an outer connection region 20a and an inner contact region 20b. In this case, the inner contact region 20b is formed by the second contact 4 through a second recess B12 of the support plate 12 in such a way that the electrically conductive top layer 15 rests with its contact region 20b against a lateral surface M4 of the second contact 4, which is shown in detail in FIG. 3.

The first temperature sensor 17 is positioned such that it faces a segment S19a of the outer connection region 19a of the first conductor region 19 of the electrically conductive top layer 15. As a result, the temperature sensor 17 is separated from the first conductor region 19 of the electrically conductive top layer 15 only by the electrically insulating layer 14, so that the thermal energy absorbed by the first conductor region 19 from the first contact 3 need only be conducted through a thin polyimide film through which the electrically insulating layer 14 is formed. Thus, the segment S19a of the first conductor region 19 and the first temperature sensor 17 arranged on the electrically conductive bottom layer 16 are arranged with respect to each other such that a heat flow passes orthogonally through the electrically insulating layer 14 to reach the first temperature sensor 17. The second temperature sensor 18 is arranged in a comparable manner.

Here, the second temperature sensor 18 is positioned such that it faces a segment S20a of the outer connection region 20a of the second conductor region 20 of the electrically conductive top layer 15. Hereby, the temperature sensor 18 is separated from the second conductor region 20 of the electrically conductive top layer 15 only by the electrically insulating layer 14, so that the temperature received by the second conductor region 20 from the second contact 4 has to be conducted only through the mentioned polyimide film by which the electrically insulating layer 14 is formed.

The electrically conductive top layer 15 is connected to the electrically insulating layer 14 around the recess A14 or B14 of the latter and is formed in particular as a copper lamination applied to the electrically insulating layer 14. In the region of the recess A14 or B14, the electrically conductive top layer 15 is formed as a continuation of the copper lamination projecting freely into the recess A14 or B14 when the contacts 3, 4 are not inserted. It is also provided that the electrically insulating layer 14, which is formed as a polyimide film, projects into the recess A14 or B14 as a support for the electrically conductive top layer 15.

The inner contact region 19b of the first conductor region 19 of the electrically conductive top layer 15 is formed as a circular ring, which is slotted radially outwardly towards the outer connection region 19a of the first conductor region 19 a plurality of times with respect to a longitudinal axis L3 of the first contact 3 and which has a plurality of contact lugs 19-1, 19-2 which are connected to the outer connection region 19a and are designated merely by way of example (see FIGS. 1, 2, 3 and 4).

The inner contact region 20b of the second conductor region 20 of the electrically conductive top layer 15 is formed as a circular ring, which is slotted radially outwardly towards the outer connection region 20a of the second conductor region 20 a plurality of times with respect to a longitudinal axis L4 of the second contact 4 and which has a plurality of contact lugs 20-1, 20-2 which are connected to the outer connection region 20a and are designated merely by way of example (see FIGS. 1, 2, 3 and 4).

The support plate 12 is rigid and the printed circuit board 10 is flexible compared to the support plate 12. The printed circuit board 10 is formed by three layers, wherein the electrically conductive top layer 15 is formed as a copper lamination, wherein the electrically insulating layer 14 is formed as a polyimide film, and wherein the electrically conductive bottom layer 16 is formed as another copper lamination. Accordingly, the printed circuit board is formed by a three-layer film. It is also provided that the top layer 15 and the bottom layer 16 are each covered by a polyimide film, not shown, for electrical insulation in regions in which they are not contacted.

Figure 4:
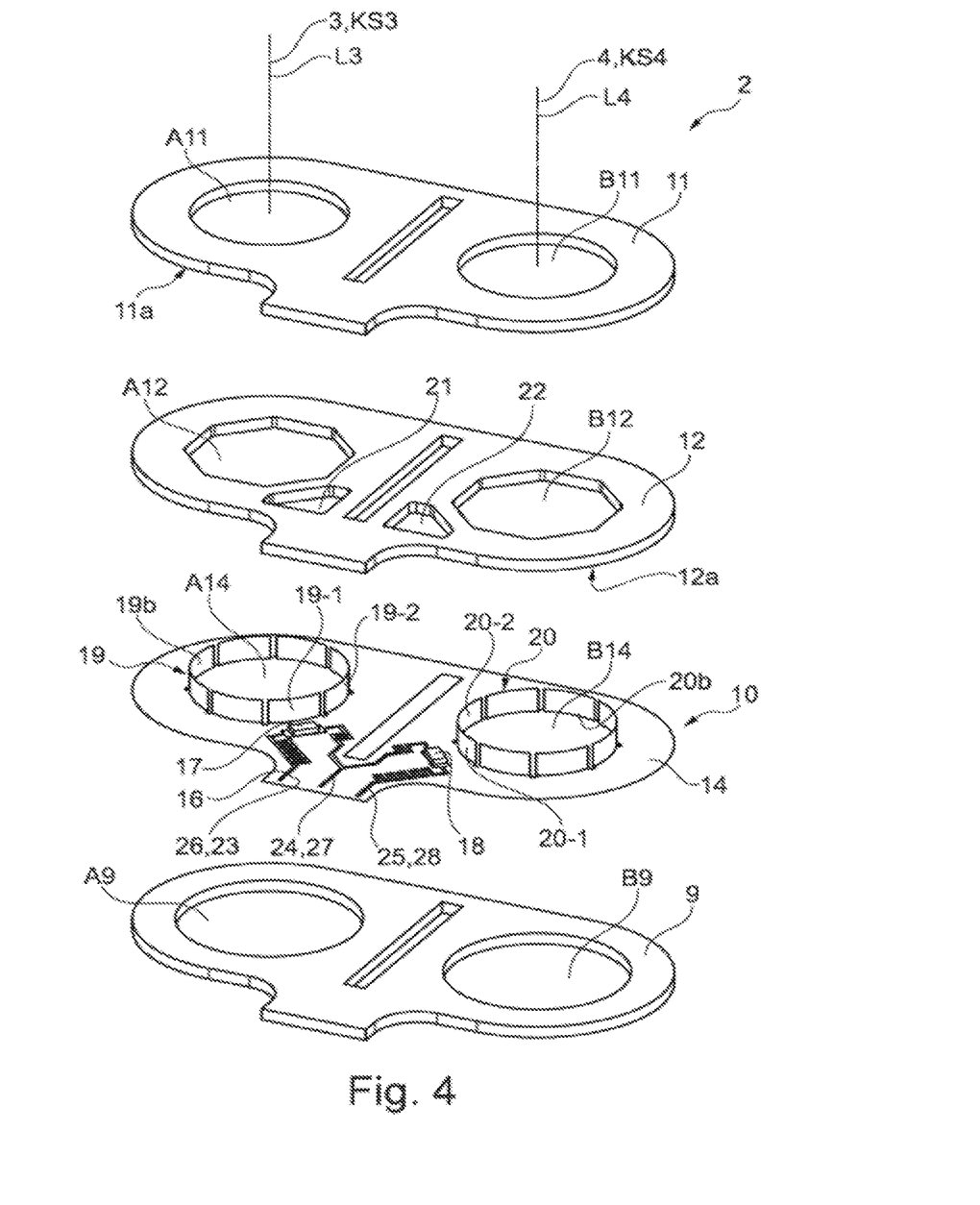
FIG. 4 shows a detail of the exploded view shown in FIG. 2 from an opposite viewing direction.

As can be seen from FIGS. 2 and 4, the support plate 12 comprises two recesses 21, 22 that are open to a top side 12a of the support plate 12 facing the printed circuit board 10. The recesses 21, 22 are positioned and dimensioned such that the first temperature sensor 17 is received in the first recess 21 and that the second temperature sensor 18 is received in the second recess 22. The recesses 21, 22 each form an encapsulation for the first temperature sensor 17 and the second temperature sensor 18, respectively, through which they are also electrically insulated from the contact pins.

The contact points 17a, 17b and 18a, 18b, respectively, to which the first and second temperature sensors 17, 18 are connected, are attached to three lines 23, 24, 25. These lines 23, 24, 25 are formed as conductor tracks 26, 27, 28 through the electrically conductive bottom layer 16. Towards the temperature sensors 17, 18, the conductor tracks 26, 27, 28 have a meandering course. In particular, these conductor tracks 26, 27, 28 are each covered by one of the polyimide films mentioned above, which are not shown. As already mentioned above, the electrically insulating layer 14 of the printed circuit board 10 is hidden in FIG. 3 and only the electrically conductive top layer 15, which comprises the first conductor region 19 and the second conductor region 20, and the electrically conductive bottom layer 16, which comprises the contact points 17a, 17b, 18a, 18b and the conductor tracks 26, 27, 28, are shown.

The temperature sensors 17, 18 are attached to the control device 5 via the lines 23, 24, 25, so that the latter can, for example, trigger a reduction of a charging current if there is a threat that a critical temperature of the first and/or second contact 3, 4 will be exceeded.

As can be seen in particular from FIGS. 1 and 2, the upper cover plate 9 rests on the printed circuit board 10 and the lower cover plate 11 rests on the support plate 12, so that a compact structure of the carrier 2 is ensured. Here, the aforementioned plates are glued to each other or connected in some other way.

The top side 12a of the support plate 12 is formed as a primary bending edge 31, 32 by peripheral edges 29, 30 adjacent to the first recess A12 and the second recess B12, respectively. Via these bending edges 31, 32 of the support plate, the electrically conductive top layer 15 in the form of the first conductor region 19 and the second conductor region 20 is bent over, in particular by almost 90°, by the first contact 3 and the second contact 4, respectively, in the fully assembled state of the electrical connection device 1. In this case, the bending takes place in a transition region between the outer connection region 19a or 20a of the first conductor region 19 or the second conductor region 20 and the inner contact region 19b or 20b of the first conductor region 19 or the second conductor region 20 of the electrically conductive top layer 15. In FIGS. 3 and 4, the electrically conductive top layer 15 is shown in this bent state, wherein the contacts are drawn in only schematically in the exploded view of FIG. 4. If—as explained above—the top layer 15 is supported by the electrically insulating layer 14, which is formed as a polyimide film, in the region of the recess A14 or B14, the electrically insulating layer 14 is of course also bent over, although this is not shown in FIG. 3. It can be seen from FIG. 3 how the inner contact region 19b bears against the lateral surface M3 of the first contact 3 and how the inner contact region 10b bears against the lateral surface M4 of the second contact 4.

The upper cover plate 9 comprises upper through-bores A9, B9 aligned with the recesses A14, B14 of the printed circuit board 10 or of its electrically insulating layer 14. The lower cover plate 11 comprises lower through-bores A11, B11 aligned with the recesses A14, B14 of the printed circuit board 10 or of its electrically insulating layer 14. The receptacles 6 and 7 of the carrier 2 are formed by the aforementioned recesses and through-bores.

Edges 33, 34 running around the through-bores A11, B11 on a top side 11a of the lower cover plate 11 form secondary bending edges 35, 36. Through these bending edges 35, 36, the electrically conductive top layer 15 of the printed circuit board 10 in the form of the first conductor region 19 and the second conductor region 20 is molded with its inner contact regions 19b and 20b, respectively, against the lateral surfaces M3 and M4 of the contacts 3, 4 in such a way that the electrically conductive layer 15 is clamped and pressed between inner lateral surfaces 37, 38 of the lower through-bores A11, B11 and the lateral surfaces M3 and M4 of the contacts 3, 4.

The two contacts 3, 4 of the electrical connection device 1 are arranged parallel to each other with respect to their longitudinal axes L3, L4. For better electrical insulation, the support plate 12 and the printed circuit board 10 and the upper cover plate 9 and the lower cover plate 11 each comprise a slot S12, S10, S9, S11. The contacts 3, 4 are each arranged in a mirror image with respect to the slot S12, S10, S9, S11.

Figure 5:
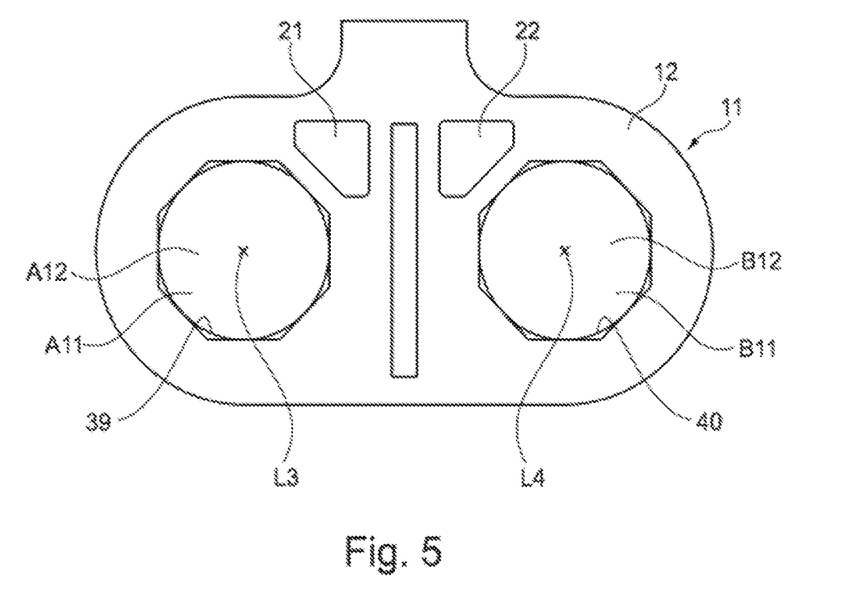
FIG. 5 shows a plan view of the support plate and the lower cover plate arranged below the support plate.

In particular, it can be seen from FIGS. 2, 4 and 5 that the recesses A12, B12 in the support plate 12 are formed as polygonal recesses and that the through-bores A11, B11 in the lower cover plate 11 are circular. In FIG. 5, the lower cover plate 11 is arranged below the support plate 12. The through-bores A11, B11 of the lower cover plate 11—viewed in a projection in the direction of the longitudinal axes L3, L4 of the contacts 3, 4 running perpendicularly into the drawing plane—each form an incircle 39 or 40 to the polygonal recess A12 or B12 of the support plate 12. Accordingly, when the contacts 3, 4 are inserted into the receptacles 6, 7 of the carrier 2 in the region of the support plate 12, the contact lugs 19-1, 19-2 or 20-1, 20-2 of the first conductor region 19 or the second conductor region 20 of the electrically conductive top layer 15 are first bent and then, in the region of the lower cover plate 11, the contact lugs 19-1, 19-2 or 20-1, 20-2 are applied over their surface against the first contact 3 or the second contact 4.

The outer connection regions 19a and 20a of the printed circuit board 10 surround the recess A14, B14 of the printed circuit board 10 in a ring-like manner, and the inner contact regions 19b and 20b of the printed circuit board 10 are formed by the contact lugs 19-1, 19-2 and 20-1, 20-2, respectively, which each extend from the outer connection regions 19a and 20a. Here, the number of contact lugs 19-1, 19-2 or 20-1, 20-2 corresponds in each case to the number of corners of the polygonal recess A12 or B12 of the support plate 12.

The contact lugs 19-1, 19-2 and 20-1, 20-2, which, in accordance with the above embodiments, may consist not only of portions of the electrically conductive top layer 15, but alternatively also of portions of the electrically conductive top layer 15 and of portions of the electrically insulating layer 14, are each formed as lugs connected to the outer connection region 19a and 20a, respectively.

The two contacts 3, 4 each comprise a circumferential collar K3 projecting beyond their lateral surface M3. With a circular ring-shaped bottom side KU3 of this collar K3, the contacts 3, 4 each rest on the outer connection region 19a or 20a of the electrically conductive top layer 15 of the printed circuit board 10, so that heat is also transferred here from the contact 3 or 4 to the first conductor region 19 or the second conductor region 20. Beyond contact surfaces with which the contact pins KS3, KS4 rest on the electrically conductive top layer 15, the latter is also protected against damage and in particular against being torn out in its outer connection region 19a or 20a by insulating layers, not shown, which are formed, for example, by the polyimide films mentioned above. The contact 4 is shown only schematically in the figures, but has a design comparable to that of the contact 3. In this case, the contacts 3, 4 are inserted into the receptacles 6 and 7 of the carrier 2 in an insertion direction x (see FIG. 2) during the mounting process.

The through-bores A9 and B9 of the upper cover plate 9 are dimensioned in such a way that they each receive the collar K3 of the contact 3 and 4, respectively, so that these each rest on the printed circuit board 10 with their collar K3.

The electrical connection device 1 shown in FIGS. 1 to 5 is formed as a charging plug LS, and its contacts 3, 4 are each formed as contact pins KS3, KS4.

According to one variant, it is also provided to form an electrical connection device as a charging socket, wherein the contacts thereof are formed as contact sleeves.

A method for mounting the electrical connection device 1, which is formed in particular in accordance with at least one of claims 1 to 15, provides
that the electrical connection device 1 comprises a carrier 2 with at least one receptacle 6, 7 and at least one contact 3, 4,
that the carrier 2, viewed in a direction of insertion x of the contact 3, 4, comprises a printed circuit board 10 with an electrically conductive top layer 15, a primary bending edge 31, 32, running circumferentially in particular in a polygonal shape, and a secondary bending edge 35, 36, running circumferentially in particular in a circular shape, and
that the electrically conductive top layer 15 projects into the receptacle 6, 7, in particular with contact lugs 19-1, 19-2, 20-1, 20-2,
and provides the following steps:
inserting the contact 3, 4 until the contact 3, 4 contacts the electrically conductive top layer 15 projecting into the receptacle 6, 7,
inserting the contact 3, 4 further into the receptacle 6, 7 and thereby bending the electrically conductive top layer 15 and in particular also the electrically insulating layer 14 by the contact 3, 4 at the primary bending edge 31, 32 and
inserting the contact 3, 4 further still into the receptacle 6, 7 and thereby bending the electrically conductive top layer 15 and in particular also the electrically insulating layer 14 by the contact 3, 4 at the secondary bending edge 35, 36 and applying the contact lugs 19-1, 19-2, 20-1, 20-2 against a lateral surface M3, M4 of the contact 3, 4 in such a way that the electrically conductive top layer 15 is applied over its entire surface against the lateral surface M3, M4 of the contact 3, 4 in a region following the secondary bending edge 35, 36.

In one example, it is provided that the electrically and thermally conductive top layer 15 is formed on a top side of the electrically insulating layer 14 of the flexible printed circuit board 10, the latter comprising the first conductor region 19 and the second conductor region 20. The first conductor region 19 and the second conductor region 20 are each formed as a copper-laminated surface, extending in a ring-like manner, with the annularly arranged contact lugs 19-1, 19-2 and 20-1, 20-2, respectively, which form contact lamellae.

These surfaces are exposed in an inner contact region 19b and 20b, respectively, namely are free of an insulation layer. These surfaces are in each case exposed in an outer contact region 19a or 20a in an annular region in which the contact pins KS3 or KS4 rest with their collar K3, namely are free of an insulation layer and are covered outside this annular region with solder resist or polyimide film. This covering of the electrically conductive top layer in all regions in which it is not in contact with the contact pins KS3 or KS4 serves to protect and provide insulation.

The outer contact regions 19a and 20a of the electrically conductive top layer 15 are formed, in respect of their shape, in such a way that they each project beyond the temperature sensor 17 or 18 lying on the electrically conductive bottom layer 16, wherein the temperature sensor 17 or 18 is arranged in each case on a bottom side of the electrically insulating layer 14.

The electrically conductive bottom layer 17 of the flexible printed circuit board 10 comprises thin conductor tracks 26 to 28 made of copper and pads or contact points 17a, 17b, 18a, 18b for placing the temperature sensors 17, 18 and attaching them in a manner that is as thermally decoupled as possible. The conductor tracks 26 to 28 are also covered with solder resist or polyimide for protection. A minimum distance free of copper is maintained from the electrically conductive bottom layer 16 to the recesses A14, B14 for the contact pins KS3, KS4.

Above the flexible printed circuit board 10, the carrier 2 comprises the upper cover plate 9 with circular through-bores A9, B9. These serve to center the contact pin KS3 or KS4 on the recesses A14, B14 of the flexible printed circuit board 10.

Below the flexible printed circuit board 10, the carrier 2 optionally comprises one or more plates—in the exemplary embodiment these are the support plate 12 and the lower cover plate 11—and by contact with this plate or these plates 11, 12, the contact lugs 19-1, 19-2 or 20-1, 20-2, also referred to as lamellae, are molded against the first contact pin KS3 and the second contact pin KS4 in a two-stage bending process during assembly of the electrical connection device 1 from their horizontal orientation with respect to the printed circuit board 10.

After the mounting process, is in particular by a bonding of the It is furthermore provided that the components of the carrier 2 are at least partially bonded to one another. It is thus ensured that the first receptacle 6 and the second receptacle 7 for the contact pins KS3 and KS4 respectively are formed concentrically by the complete assembly. Adhesive can also be used to reduce creepage distances.

Although the present invention has been described with reference to preferred embodiments, workers skilled in the art will recognize that changes may be made in form and detail without departing from the spirit and scope of the invention.

LIST OF REFERENCE SIGNS 1 electrical connection device
2 carrier
3 first contact
4 second contact
5 control device
6 first receptacle in 2 for 3

7 second receptacle in 2 for 4
9 upper cover plate of 2
10 printed circuit board of 2
11 lower cover plate of 2
11a top side of 11
12 support plate
12a top side of 12
14 electrically insulating layer of 10
15 electrically conductive top layer of 10
16 electrically conductive bottom layer of 10
17 first temperature sensor
17a, 17b contact point on 16 for 17
18 second temperature sensor
18a, 18b contact point on 16 for 18
19 first conductor region of 15
19a outer connection region of 19
19b inner contact region of 19
19-1, 19-2 contact lug of 19 or 15 or 10
20 second conductor region of 15
20a outer connection region of 20
20b inner contact region of 20
20-1, 20-2 contact lug of 20 or 15 or 10
21, 22 recess in 12 for 17, 18
23-25 line to 17, 18
26-28 conductor track formed by 16
29, 30 circumferential edge of 12 to form A12 or B12
31, 32 first bending edge formed by 29 or 30 on 12
33, 34 circumferential edges around A11, B11 on 11a of 11
35, 36 second bending edge formed by 33, 34 on 11
37, 38 inner lateral surface of A11, B11
39, 40 incircle formed by A11, B11
A9, B9 through-bore in 9
A11, B11 through-bore in 11
A12, B12 first, second polygonal recess in 12
A14, B14 first, second recess in 14
K3, collar of 3
KU3 bottom side of K3
KS3, KS4 contact pin formed by 3, 4
L3, L4 longitudinal axis of 3, 4
LS charging plug
M3, M4 lateral surface of 3, 4
S9-S12 slot in 9, 10, 11, 12
S19a, S20a segment of 19a, 20a
x insertion direction

The invention claimed is:

1. An electrical connection device comprising:
at least one contact and a carrier,
wherein the carrier comprises at least one receptacle and the at least one contact is inserted into the at least one receptacle,
wherein the carrier comprises a printed circuit board and at least one temperature sensor,
wherein the at least one temperature sensor is arranged on the printed circuit board in a vicinity of the at least one contact,
wherein the printed circuit board comprises an electrically insulating layer and an electrically conductive top layer separated from a support plate by the electrically insulating layer,
wherein the electrically conductive top layer is arranged in a region of a recess of the electrically insulated layer and comprises an outer connection region and an inner contact region, and
wherein the inner contact region is formed by the at least one contact through a recess of the support plate in such a way that the electrically conductive top layer rests against a lateral surface of the at least one contact.

2. The electrical connection device as claimed in claim 1, wherein the electrically conductive top layer is connected to the electrically insulating layer around the recess of the electrically insulated layer.

3. The electrical connection device as claimed in claim 1, wherein the support plate is rigid, and the printed circuit board is flexible compared to the support plate.

4. The electrical connection device as claimed in claim 1, wherein the printed circuit board comprises an electrically conductive bottom layer as a third layer, wherein the electrically conductive bottom layer is galvanically isolated from the electrically conductive top layer by the electrically insulating layer, wherein the at least one temperature sensor is arranged on the electrically conductive bottom layer and is connected to contact points formed by the electrically conductive bottom layer, wherein the at least one temperature sensor is positioned in such a way that it faces a segment of the electrically conductive top layer.

5. The electrical connection device as claimed in claim 1, wherein the support plate comprises at least one recess, wherein the at least one recess is open towards the top side of the support plate facing the printed circuit board, and the recess is positioned and dimensioned in such a way that the at least one temperature sensor is received in the recess.

6. The electrical connection device as claimed in claim 4, wherein
the contact points to which the at least one temperature sensor is connected are attached to lines, in that the lines in the form of conductor tracks are formed by the electrically conductive bottom layer and have a meandering course towards the at least one temperature sensor, and
wherein the electrical connection device comprises a control device, and the at least one temperature sensor is attached to the control device via the lines.

7. The electrical connection device as claimed in claim 1, wherein at least one of:
the electrical connection device comprises an upper cover plate resting on the printed circuit board, or
the electrical connection device comprises a lower cover plate resting on the support plate.

8. The electrical connection device as claimed in claim 1, wherein a top side of the support plate adjacent to the recess thereof is formed as a primary bending edge over which the electrically conductive top layer of the printed circuit board is bent by 5° to 90°.

9. The electrical connection device as claimed in claim 1, and further comprising at least one of:
an upper cover plate comprising an upper through-bore aligned with the recesses of the printed circuit board, wherein the upper cover plate covers a top side of the printed circuit board, or
a lower cover plate comprising a lower through-bore aligned with the recesses of the printed circuit board, wherein the lower cover plate covers a bottom side of the support plate.

10. The electrical connection device as claimed in claim 9, wherein a circumferential edge of the lower cover plate, at which a top side of the lower cover plate transitions into a lower through-bore, forms a secondary bending edge, by which the electrically conductive top layer of a coupling plate is molded against the lateral surface of the at least one contact in such a way that the electrically conductive top layer is clamped between an inner lateral surface of the lower through-bore and the lateral surface of the at least one contact.

11. The electrical connection device as claimed in claim 9, wherein
the at least one contact comprises two contacts, and
the carrier comprises:
the support plate,
the printed circuit board,
the upper cover plate,
the lower cover plate; and
the upper and lower cover plates are connected to one another and each comprise a slot arranged between the two contacts, wherein the two contacts are arranged in a mirror image with respect to the slots.

12. The electrical connection device as claimed in claim 10, wherein the recess in the support plate is formed as a polygonal recess, and the lower through-bore in the lower cover plate is circular, and wherein the lower through-bore forms an incircle of the polygonal recess in a projection in a direction of a longitudinal axis of the contact.

13. The electrical connection device as claimed in claim 12, wherein the outer connection region of the region of the electrically conductive top layer surrounds the recess of the printed circuit board in a ring-like manner, and the inner contact region of the electrically conductive top layer is formed by contact lugs extending from the outer connection region, wherein it is provided in particular that the number of contact lugs corresponds to the number of corners of the polygonal recess of the support plate.

14. The electrical connection device as claimed in claim 1, wherein the at least one contact comprises a circumferential collar projecting beyond a lateral surface of the at least one contact and the at least one contact rests with a circular-ring-shaped bottom side of the circumferential collar on the outer connection region of the electrically conductive top layer of the printed circuit board.

15. The electrical connection device as claimed in claim 1, wherein at least one of:
the electrical connection device is formed as a charging plug and the at least one contact is formed as a contact pin, or
the electrical connection device is formed as a charging socket and the at least one contact is formed as a contact sleeve.

16. A method for assembling an electrical connection device including a carrier with at least one receptacle and at least one contact, the method comprising:
inserting the at least one contact until the at least one contact touches an electrically conductive top layer projecting into the at least one receptacle,
inserting the at least one contact further into the at least one receptacle and thereby bending the electrically conductive top layer by the at least one contact at a primary bending edge, wherein the carrier, viewed in a direction of insertion of the at least one contact, comprises a printed circuit board with the electrically conductive top layer, the primary bending edge running circumferentially, and a secondary bending edge running circumferentially, and
inserting the at least one contact further still into the at least one receptacle and thereby bending the electrically conductive top layer by the at least one contact at the secondary bending edge and applying contact lugs against a lateral surface of the at least one contact in such a way that the electrically conductive top layer is applied over an entire surface of the electrically conductive top layer against the lateral surface of the at least one contact in a region following the secondary bending edge.

17. The method of claim 16, wherein the primary bending edge runs in a polygonal shape, and the secondary bending edge runs in a circular shape.

18. The method of claim 16, wherein the electrically conductive top layer projects into the at least one receptacle with contact lugs.

19. The method of claim 16, wherein the electrically conductive top layer is connected to an electrically insulating layer around a recess of the electrically insulated layer.

20. The method of claim 19, wherein the printed circuit board comprises the electrically insulating layer and the electrically conductive top layer separated from a support plate by the electrically insulating layer, and wherein the printed circuit board is flexible compared to the support plate.

* * * * *